US011973483B2

(12) United States Patent
Nielsen

(10) Patent No.: US 11,973,483 B2
(45) Date of Patent: Apr. 30, 2024

(54) COUPLED FILTER INDUCTOR FOR INTERLEAVED POWER CONVERTER

(71) Applicant: SCHNEIDER ELECTRIC IT CORPORATION, Foxboro, MA (US)

(72) Inventor: Henning Roar Nielsen, Brenderup (DK)

(73) Assignee: SCHNEIDER ELECTRIC IT CORPORATION, Foxboro, MA (US)

( * ) Notice: Subject to any disclaimer, the term of this patent is extended or adjusted under 35 U.S.C. 154(b) by 154 days.

(21) Appl. No.: 17/662,299

(22) Filed: May 6, 2022

(65) Prior Publication Data

US 2023/0361743 A1    Nov. 9, 2023

(51) Int. Cl.
| | | |
|---|---|---|
| H03H 7/01 | (2006.01) | |
| H03H 1/00 | (2006.01) | |
| H03H 7/09 | (2006.01) | |

(52) U.S. Cl.
CPC ............ *H03H 7/0138* (2013.01); *H03H 7/09* (2013.01); *H03H 1/0007* (2013.01)

(58) Field of Classification Search
CPC ...... H03H 7/09; H03H 7/0115; H03H 1/0007; H03H 7/0138
USPC ................. 333/175, 177, 181, 185
See application file for complete search history.

(56) References Cited

U.S. PATENT DOCUMENTS

| 7,403,400 | B2 | 7/2008 | Stanley |
|---|---|---|---|
| 9,425,693 | B2 | 8/2016 | Wang et al. |
| 9,480,126 | B1 * | 10/2016 | Xiong ............... H05B 41/2858 |
| 2009/0212640 | A1 | 8/2009 | Terorde |
| 2020/0217881 | A1 | 7/2020 | Lefevre |

FOREIGN PATENT DOCUMENTS

| EP | 0837548 A2 | 4/1998 |
|---|---|---|
| EP | 4274069 A1 | 11/2023 |

OTHER PUBLICATIONS

Extended European Search Report from corresponding European Application No. 23169975.2 dated Sep. 25, 2023.

* cited by examiner

*Primary Examiner* — Rakesh B Patel
(74) *Attorney, Agent, or Firm* — Lando & Anastasi, LLP

(57) ABSTRACT

Aspects of the disclosure include a filter comprising a first interleaved input, a second interleaved input, an output, a first transformer comprising a first primary winding with N1 turns and a first secondary winding with N2 turns, and a second transformer comprising a second primary winding with N3 turns and a second secondary winding with N4 turns, wherein the first primary winding and the second secondary winding are in series with the first interleaved input and the output, and the first secondary winding and the second primary winding are in series with the second interleaved input and the output.

23 Claims, 5 Drawing Sheets

COUPLED FILTER INDUCTOR FOR INTERLEAVED POWER CONVERTER

BACKGROUND

1. Field of the Disclosure

At least one example in accordance with the present disclosure relates generally to power devices.

2. Discussion of Related Art

Power devices, such as uninterruptible power supplies, may be used to provide power to one or more loads. Power devices may include power converters, such as DC/DC converters, AC/DC converters, and DC/AC converters. DC/DC converters convert DC power of one voltage level to DC power of another voltage level. DC/AC converters, or "inverters," convert DC power to AC power. AC/DC converters, or "rectifiers," convert AC power to DC power.

SUMMARY

According to at least one aspect of the present disclosure, a filter is provided comprising a first interleaved input, a second interleaved input, an output, a first transformer comprising a first primary winding with N1 turns and a first secondary winding with N2 turns, and a second transformer comprising a second primary winding with N3 turns and a second secondary winding with N4 turns, wherein the first primary winding and the second secondary winding are in series with the first interleaved input and the output, and the first secondary winding and the second primary winding are in series with the second interleaved input and the output.

In at least one example, the first primary winding and the first secondary winding are configured to generate in-phase magnetic fields that cancel each other. In some examples, the second primary winding and the second secondary winding are configured to generate in-phase magnetic fields that cancel each other. In various examples, a number of turns of N1 is within 20% of a number of turns of N4. In at least one example, a number of turns of N2 is within 20% of a number of turns of N3. In some examples, a number of turns of N2 is within 20% of a number of turns of N3. In at least one example, a dotted pole of the first primary winding is coupled to the first interleaved input, and a non-dotted pole of the first primary winding is coupled to the second secondary winding.

In some examples, a non-dotted pole of the first secondary winding is coupled to the second interleaved input, and a dotted pole of the first secondary winding is coupled to the second primary winding. In various examples, a non-dotted pole of the second secondary winding is coupled to the non-dotted pole of the first primary winding, and a dotted pole of the second secondary winding is coupled to the output. In at least one example, a dotted pole of the second primary winding is coupled to the first secondary winding, and a non-dotted pole of the second primary winding is coupled to the output. In some examples, a non-dotted pole of the first secondary winding is coupled to the second interleaved input, and a dotted pole of the first secondary winding is coupled to the dotted pole of the second primary winding.

In various examples, the first interleaved input is configured to be coupled to a first interleaved inverter, and the second interleaved input is configured to be coupled to a second interleaved inverter. In at least one example, a series of the first primary winding and the second secondary winding is coupled in parallel with a series combination of the first secondary winding and the second primary winding. In some examples, the first interleaved input is configured to receive a first signal and the second interleaved input is configured to receive a second signal having a phase opposite that of the first signal. In various examples, a first magnetic field generated by the first primary winding responsive to receiving the first signal sums with a second magnetic field generated by the second primary winding responsive to receiving the second signal.

In at least one example, responsive to receiving the first signal at an opposite-phase frequency and the second signal at the opposite-phase frequency, the first transformer and the second transformer present an impedance to the first and second signal that is proportional to a square of a sum of N1 and N2. In some examples, the first interleaved input and the second interleaved input are configured to be coupled to a power converter having one or more switches configured to receive pulse-width modulation switching signals, and the opposite-phase frequency of the first signal and the second signal is a frequency of the pulse-width modulation switching signals. In various examples, the first interleaved input is configured to receive a first signal and the second interleaved input is configured to receive a second signal in phase with the first signal.

In at least one example, a first magnetic field generated by the first primary winding responsive to receiving the first signal cancels with a second magnetic field generated by the second primary winding responsive to receiving the second signal. In some examples, responsive to receiving the first signal at an in-phase frequency and the second signal at the in-phase frequency, the first transformer and the second transformer present an impedance to the first and second signal that is proportional to a square of a difference between N1 and N2. In various examples, the output is configured to be coupled to, and provide output power to, at least one load, and wherein the in-phase frequency of the first signal and the second signal is a frequency of the output power.

According to at least one example of the disclosure, a filtering system is provided comprising a first interleaved input configured to be coupled to a first power converter, a second interleaved input configured to be coupled to a second power converter, an output, and means for reducing a ripple current received from at least one of the first power converter or the second power converter.

According to at least one example of the disclosure, a method of filtering a signal is provided, the method comprising receiving, at a first interleaved input, a first signal, providing the first signal to a first primary winding of a first transformer comprising the first primary winding with N1 turns and a first secondary winding with N2 turns, providing the first signal from the first primary winding to a second secondary winding of a second transformer comprising a second primary winding with N3 turns and the second secondary winding with N4 turns, providing the first signal from the second secondary winding to an output, receiving, at a second interleaved input, a second signal, providing the second signal to the first secondary winding, providing the second signal from the first secondary winding to the second primary winding, and providing the second signal from the second primary winding to the output.

BRIEF DESCRIPTION OF THE DRAWINGS

Various aspects of at least one embodiment are discussed below with reference to the accompanying figures, which are not intended to be drawn to scale. The figures are included to provide an illustration and a further understanding of the various aspects and embodiments, and are incorporated in and constitute a part of this specification, but are not intended as a definition of the limits of any particular embodiment. The drawings, together with the remainder of the specification, serve to explain principles and operations of the described and claimed aspects and embodiments. In the figures, each identical or nearly identical component that is illustrated in various figures is represented by a like numeral. For purposes of clarity, not every component may be labeled in every figure. In the figures:

DETAILED DESCRIPTION

Figure 1:
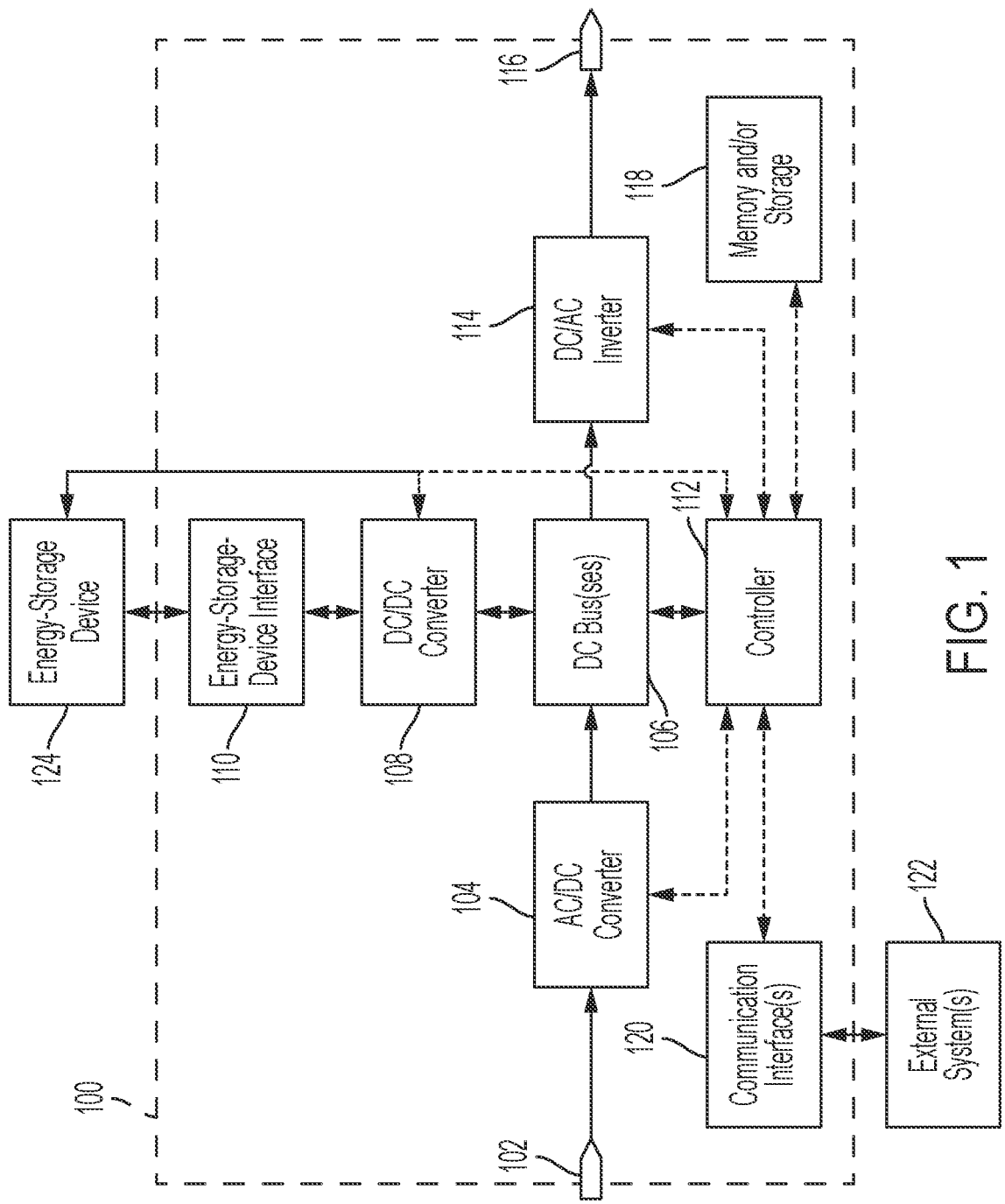
FIG. 1 illustrates a block diagram of an uninterruptible power supply according to an example.

Examples of the methods and systems discussed herein are not limited in application to the details of construction and the arrangement of components set forth in the following description or illustrated in the accompanying drawings. The methods and systems are capable of implementation in other embodiments and of being practiced or of being carried out in various ways. Examples of specific implementations are provided herein for illustrative purposes only and are not intended to be limiting. In particular, acts, components, elements and features discussed in connection with any one or more examples are not intended to be excluded from a similar role in any other examples.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items.

References to "or" may be construed as inclusive so that any terms described using "or" may indicate any of a single, more than one, and all of the described terms. In addition, in the event of inconsistent usages of terms between this document and documents incorporated herein by reference, the term usage in the incorporated features is supplementary to that of this document; for irreconcilable differences, the term usage in this document controls.

As discussed above, power devices such as uninterruptible power supplies (UPS) may include one or more power converters. Power converters convert power from one state to another. Power converters may include one or more switches configured to open or close in response to receiving pulse-width-modulation (PWM) signals from a controller. The controller may control the conversion of power using the PWM signals.

In some examples, it may be advantageous to interleave two or more power-converter legs. Rather than implementing a single power converter to convert power, two or more converter legs may be connected in parallel. The PWM signals provided to the two or more converter legs may be time-shifted based on the number of converter legs. In one example, the PWM signals may be time-shifted by 360/n degrees, where n is the number of interleaved power-converter legs. For example, in the case of two interleaved converter legs, a controller may provide PWM signals to the two interleaved converter legs that are time-shifted by 180°.

Interleaving may advantageously reduce ripple current at the PWM frequency (and odd harmonics thereof) as compared to implementing a single power converter. Total ripple current may be reduced at least in part because the ripple current in one converter leg at the PWM frequency (and odd harmonics thereof) may be opposite in phase from the ripple current in the other converter leg. The ripple currents from each leg can thus cancel each other out at the PWM frequency and odd harmonics thereof.

Reducing the ripple current may enable a reduction in size of filter components coupled to power converters, such as capacitors and inductors. However, other factors may impact the size of the filter components. For example, reducing the size of one or more components may adversely impact dynamic performance of the filter when presented with a load step. A load step may cause a decrease in output voltage which increases as component size decreases. Accordingly, component size may be selected at least in part based on dynamic-performance constraints, which may be specified by regulatory authorities or advisories in terms of an acceptable voltage drop caused by a load step.

Examples described herein provide filters configured to reduce ripple current while improving dynamic performance compared to existing solutions. In one example, a filter includes two or more interleaved coupled inductors connected to an output of a power converter. Interleaving may advantageously improve dynamic performance at least in part by presenting a short circuit to load-step current. Furthermore, the arrangement of interleaved coupled inductors may advantageously avoid excessive core loss at least in part because both coupled inductors can filter out both even and odd harmonics. Accordingly, filters provided herein improve filter performance relative to existing filters.

As discussed above, filters are often employed in power devices, such as UPSs. FIG. 1 is a block diagram of a UPS 100 according to an example. In another example, FIG. 1 may illustrate a block diagram of one of several power modules of a UPS. The UPS 100 includes an input 102, an AC/DC converter 104, one or more DC busses 106, a DC/DC converter 108, an energy-storage-device interface 110, at least one controller 112 ("controller 112"), a DC/AC inverter 114, an output 116, a memory and/or storage 118, and one or more communication interfaces 120 ("communication interfaces 120"), which may be communicatively coupled to one or more external systems 122 ("external systems 122").

The input 102 is coupled to the AC/DC converter 104 and to an AC power source (not pictured), such as an AC mains power supply. The AC/DC converter 104 is coupled to the input 102 and to the one or more DC busses 106, and is communicatively coupled to the controller 112. The one or more DC busses 106 are coupled to the AC/DC converter 104, the DC/DC converter 108, and to the DC/AC inverter 114, and are communicatively coupled to the controller 112. The DC/DC converter 108 is coupled to the one or more DC busses 106 and to the energy-storage-device interface 110, and is communicatively coupled to the controller 112. The energy-storage-device interface 110 is coupled to the DC/DC converter 108, and is configured to be coupled to at least one energy-storage device 124 and/or another energy-storage device.

In some examples, the energy-storage device 124 is external to the UPS 100 and coupled to the UPS 100 via the energy-storage-device interface 110. In various examples, the UPS 100 may include one or more energy-storage devices, which may include the energy-storage device 124. The energy-storage device 124 may include one or more batteries, capacitors, flywheels, or other energy-storage devices.

The DC/AC inverter 114 is coupled to the one or more DC busses 106 and to the output 116, and is communicatively coupled to the controller 112. The output 116 is coupled to the DC/AC inverter 114, and to an external load (not pictured). The controller 112 is communicatively coupled to the AC/DC converter 104, the one or more DC busses 106, the DC/DC converter 108, the energy-storage-device interface 110, the DC/AC inverter 114, the memory and/or storage 118, and the communication interfaces 120.

The input 102 is configured to be coupled to an AC mains power source and to receive input AC power having an input voltage level. The UPS 100 is configured to operate in different modes of operation based on the input voltage of the AC power provided to the input 102. The controller 112 may determine a mode of operation in which to operate the UPS 100 based on whether the input voltage of the AC power is acceptable. The controller 112 may include or be coupled to one or more sensors configured to sense parameters of the input voltage. For example, the controller 112 may include or be coupled to one or more sensors configured to sense a voltage level of the AC power received at the input 102.

When AC power provided to the input 102 is acceptable (for example, by having parameters, such as an input voltage value, that meet specified values, such as by falling within a range of acceptable input voltage values), the controller 112 controls components of the UPS 100 to operate in a normal mode of operation. In the normal mode of operation, AC power received at the input 102 is provided to the AC/DC converter 104. The AC/DC converter 104 converts the AC power into DC power and provides the DC power to the one or more DC busses 106. The one or more DC busses 106 distribute the DC power to the DC/DC converter 108 and to the DC/AC inverter 114. The DC/DC converter 108 converts the received DC power and provides the converted DC power to the energy-storage-device interface 110. The energy-storage-device interface 110 receives the converted DC power, and provides the converted DC power to the energy-storage device 124 to charge the energy-storage device 124. The DC/AC inverter 114 receives DC power from the one or more DC busses 106, converts the DC power into regulated AC power, and provides the regulated AC power to the output 116 to be delivered to a load.

When AC power provided to the input 102 from the AC mains power source is not acceptable (for example, by having parameters, such as an input voltage value, that do not meet specified values, such as by falling outside of a range of acceptable input voltage values), the controller 112 controls components of the UPS 100 to operate in a backup mode of operation. In the backup mode of operation, DC power is discharged from the energy-storage device 124 to the energy-storage-device interface 110, and the energy-storage-device interface 110 provides the discharged DC power to the DC/DC converter 108. The DC/DC converter 108 converts the received DC power and distributes the DC power amongst the one or more DC busses 106. For example, the DC/DC converter 108 may evenly distribute the power amongst the one or more DC busses 106. The one or more DC busses 106 provide the received power to the DC/AC inverter 114. The DC/AC inverter 114 receives the DC power from the one or more DC busses 106, converts the DC power into regulated AC power, and provides the regulated AC power to the output 116.

The controller 112 may store information in, and/or retrieve information from, the memory and/or storage 118. For example, the controller 112 may store information indicative of sensed parameters (for example, input-voltage values of the AC power received at the input 102) in the memory and/or storage 118. The controller 112 may further receive information from, or provide information to, the communication interfaces 120. The communication interfaces 120 may include one or more communication interfaces including, for example, user interfaces (such as display screens, touch-sensitive screens, keyboards, mice, track pads, dials, buttons, switches, sliders, light-emitting components such as light-emitting diodes, sound-emitting components such as speakers, buzzers, and so forth configured to output sound inside and/or outside of a frequency range audible to humans, and so forth), wired communication interfaces (such as wired ports), wireless communication interfaces (such as antennas), and so forth, configured to exchange information with one or more systems, such as the external systems 122, or other entities, such as human beings. The external systems 122 may include any device, component, module, and so forth, that is external to the UPS 100, such as a server, database, laptop computer, desktop computer, tablet computer, smartphone, central controller or data-aggregation system, other UPSs, and so forth.

In some examples, the UPS 100 may be a multi-phase UPS, such as a three-phase UPS. For example, the input 102 may include multiple inputs each configured to receive a respective phase line (and, in some examples, the multiple inputs may include a return input). Accordingly, although examples of FIG. 1 may be described with respect to a single connection and/or single-phase operation, it is to be appreciated that multi-phase operation is within the scope of FIG. 1 and the disclosure as a whole.

As discussed above, power converters may include and/or be coupled to filters. For example, one or more of the converters 104, 108, 114 may include, and/or be coupled to, one or more filters. The converters 104, 108, 114 may include one or more filtering components to, for example, reduce ripple current. In some examples, the converters 104, 108, 114 may each be implemented with multiple interleaved converter legs in a single- or multi-phase system. For example, the UPS 100 may be a three-phase UPS and one or more of the converters 104, 108, 114 includes two or more interleaved power-conversion legs. For purposes of explanation, examples are provided in which one or more of the converters 104, 108, 114 includes two or more interleaved power-conversion legs.

Figure 2:
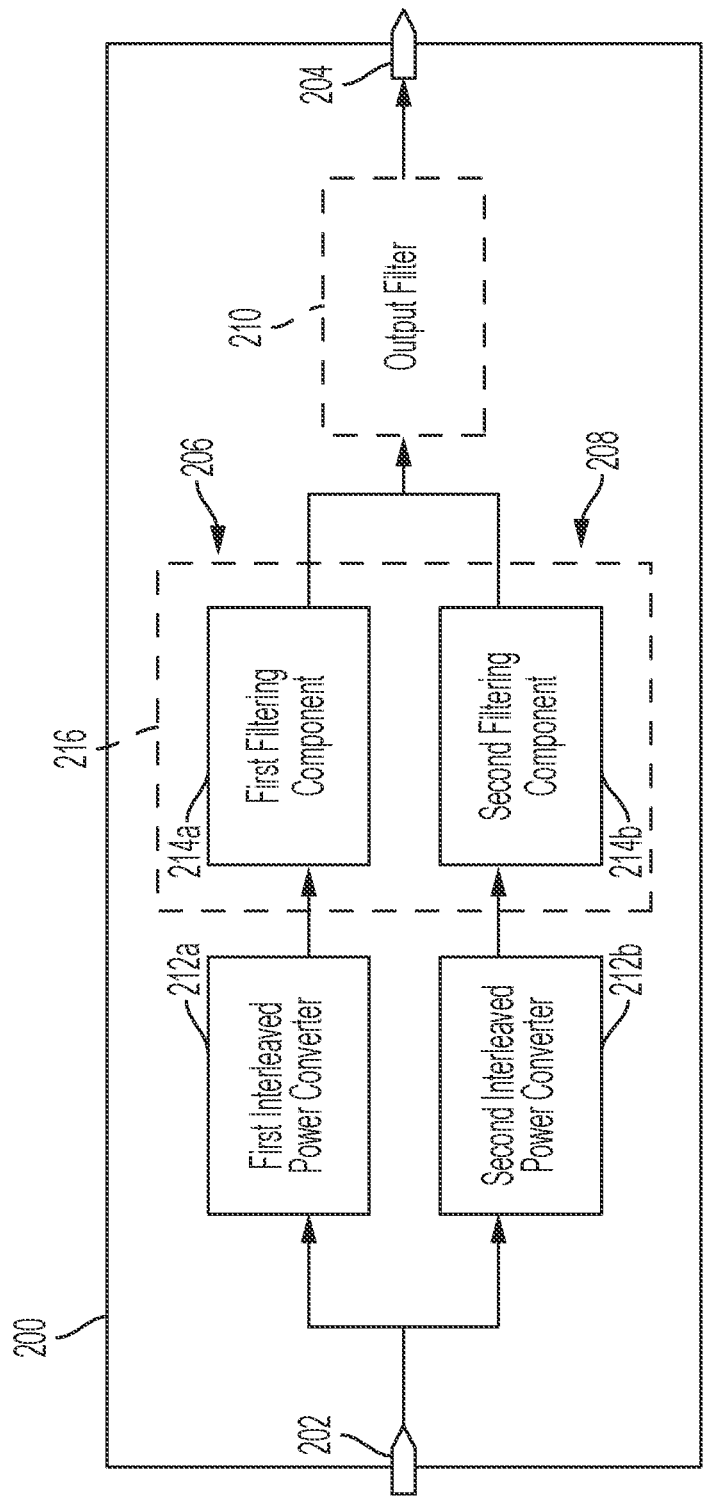
FIG. 2 illustrates a block diagram of a power converter according to an example.

FIG. 2 illustrates a block diagram of a power converter 200 according to an example. The power converter 200 may be an example of any of the power converters 104, 108, 114 in some examples. The power converter 200 includes an input 202, an output 204, a first leg 206, a second leg 208, and, in some examples, an optional output filter 210. The first leg 206 includes a first interleaved power converter 212a and one or more filtering components 214a ("first filtering component 214a"). The second leg 208 includes a second interleaved power converter 212b and one or more filtering components 214b ("second filtering component 214b"). The first filtering component 214a and the second filtering component 214b collectively comprise a filter 216. It is to be appreciated that the power converter 200 may include any arbitrary number of interleaved legs (including three or more legs), and that two legs are illustrated for purposes of example only.

The input 202 is coupled to the legs 206, 208, and is configured to be coupled to a power source and/or power sink. The legs 206, 208 are coupled in parallel with one another, and each is coupled to the input 202 at a respective first connection and to the optional output filter 210 at a respective second connection. In examples in which the optional output filter 210 is not included, the legs 206, 208 may be coupled directly to the output 204 at the respective second connection. The optional output filter 210, in examples in which the filter 210 is included, is coupled to the legs 206, 208 at a first connection and to the output 204 at a second connection. The output 204 is coupled to the optional output filter 210 and is configured to be coupled to a power sink and/or power source. In examples in which the optional output filter 210 is not included, the output 204 may be coupled to the filter 216 in lieu of the optional output filter 210.

In each of the legs 206, 208, a respective interleaved power converter 212 (that is, either of the power converters 212a, 212b) is coupled to a corresponding filtering component 214 (that is, a corresponding one of the filtering components 214a, 214b) at a first connection, and is coupled to the input 202 at a second connection. Each of the filtering components 214 is coupled to a corresponding one of the interleaved power converters 212 at a first connection, and is coupled to the optional output filter 210 at a second connection. In examples in which the optional output filter 210 is not included, each of the filtering components 214 may be coupled directly to the output 204 at the second connection.

Although the filtering components 214 are illustrated as separate components for purposes of explanation, in some examples the filtering components 214 may be coupled to each other. For example, the first filtering component 214a may include at least one first inductor and the second filtering component 214b may include at least one second inductor magnetically coupled to the at least one first inductor, such that the filtering components 214 collectively comprise the filter 216. In other examples, the filtering components 214 may operate independently from one another.

As discussed above, the power converter 200 may be implemented as any of the power converters 104, 108, 114. For example, where the power converter 200 is an implementation of the AC/DC converter 104, the input 202 may be coupled to the input 102, and the output 204 may be coupled to the DC busses 106. It is to be appreciated that no limitation is implied by the term "input." One or more of the power converters 104, 108, 114 may be bi-directional. For example, the DC/DC converter 108 may draw power from the energy-storage device 124 via the energy-storage-device interface 110 at one point in time (for example, during the backup mode of operation in which mains power is unavailable, as discussed above), and may provide power to the energy-storage device 124 via the energy-storage-device interface 110 at another point in time (for example, during the normal mode of operation in which mains power is available and used to charge the energy-storage device 124, as discussed above).

Accordingly, although the power converter 200 may be described with respect to providing power in a certain direction (for example, drawing power at the input 202 and providing power at the output 204), it is to be appreciated that the power converter 200, or other power converters within the scope of the disclosure, may be bi-directional. For example, where the power converter 200 is an implementation of the DC/DC converter 108, the input 202 may be coupled to the DC busses 106 and the output 204 may be coupled to the energy-storage-device interface 110. However, because the DC/DC converter 108 may be bi-directional in some examples, the DC/DC converter 108 may also provide power to the DC busses 106 at the input 202 and receive power from the energy-storage-device interface 110 at the output 204. It is therefore to be appreciated that components referred to as "inputs" may provide and/or receive power and components referred to as "outputs" may receive and/or provide power.

Each of the interleaved power converters 212 may include one or more switches. The one or more switches may be modulated to convert power. The controller 112 may be coupled to each of the interleaved power converters 212 to control the one or more switches, and thereby control power conversion. For example, the controller 112 may send one or more PWM signals to the one or more switches to control a respective switching state of each of the one or more switches.

The controller 112 may send time-shifted PWM signals to the interleaved power converters 212. As understood by one of ordinary skill in the art, time-shifted PWM signals may be identical except that the signals are shifted in time relative to one another. In various examples, the signals may be shifted by 360/n degrees, where n is the number of interleaved power converters. For example, if the interleaved power converters 212 include three interleaved power converters, the controller 112 may provide PWM signals to the interleaved power converters 212 that are time-shifted by 120°. Similarly, if the interleaved power converters 212 include two interleaved power converters, the controller 112 may provide PWM signals to the interleaved power converters 212 that are time-shifted by 180°. An example of a system having two interleaved power converters 212 is provided below.

Figure 3:
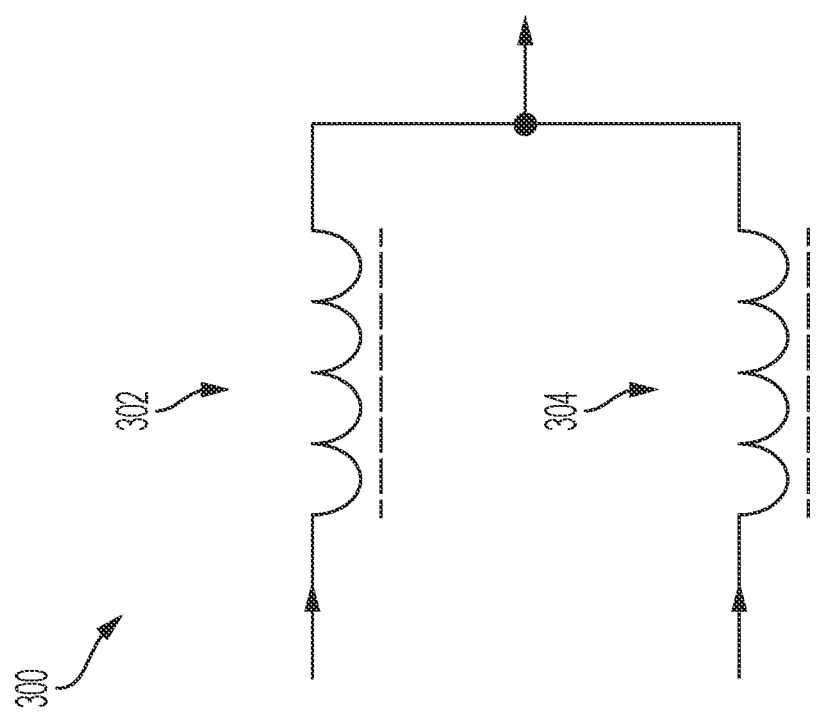
FIG. 3 illustrates a schematic diagram of a filter according to an example.

FIG. 3 illustrates a schematic diagram of a filter 300 according to an example. The filter 300 may illustrate an example of the filter 216. The filter 300 includes a first inductor 302 and a second inductor 304. The first inductor 302 may illustrate an example of the first filtering component 214a. The second inductor 304 may illustrate an example of the second filtering component 214b. In some examples, the inductors 302, 304 are magnetically coupled to one another. In other examples, the inductors 302, 304 are not magnetically coupled to one another.

The first inductor 302 is configured to be coupled to a first power converter at a first connection (for example, to the first interleaved power converter 212a), and is configured to be coupled to an output at a second connection (for example, to the output 204 either directly or, in some examples, via the optional output filter 210). The second inductor 304 is configured to be coupled to a second power converter at a first connection (for example, to the second interleaved power converter 212b), and is configured to be coupled to an output at a second connection (for example, to the output 204 either directly or, in some examples, via the optional output filter 210).

The filter 300 may filter a signal received from interleaved power converters to provide a filtered output signal to an output. For example, where the filter 300 is an example of the filter 216, the filter 300 may filter a signal received from the interleaved power converters 212 to provide a filtered output signal to the output 204. The filter 300 may reduce ripple current and smooth an output signal (for example, by smoothing a relatively square wave to a relatively sinusoidal wave). However, a size of the inductors 302, 304 may be relatively large to achieve a desired ripple-current reduction, which may adversely impact the dynamic response of the filter 300.

Figure 4:
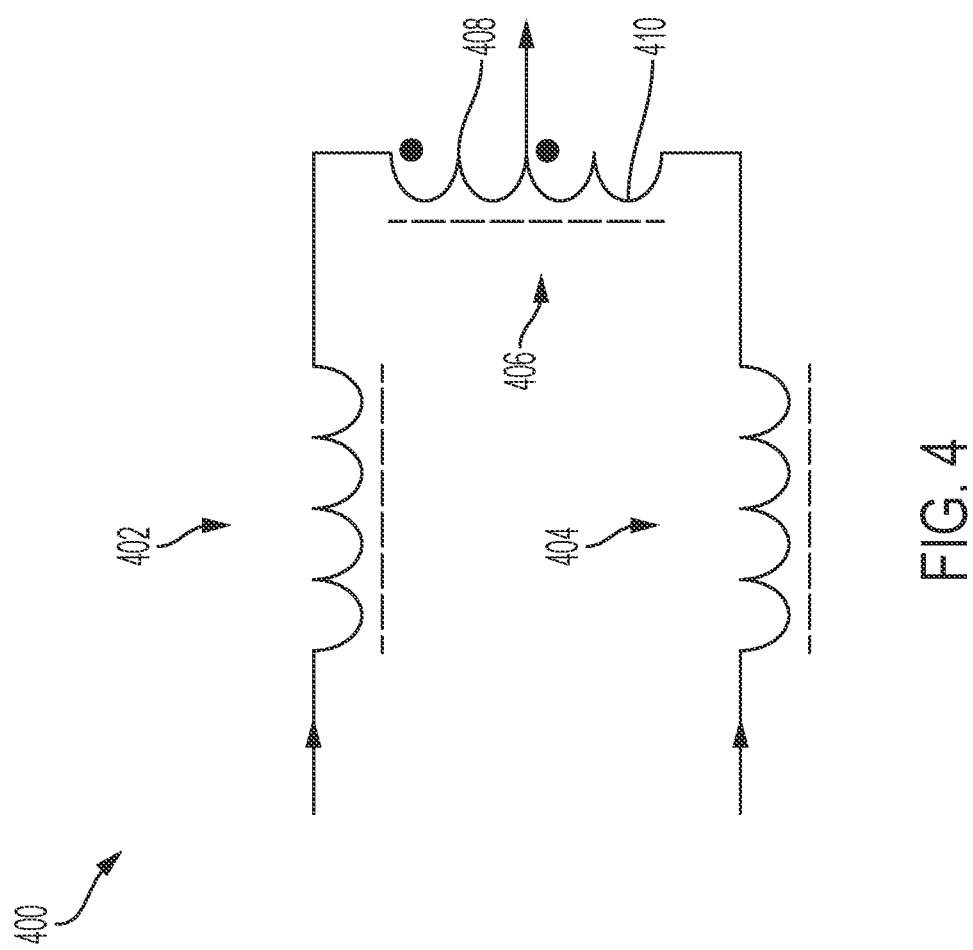
FIG. 4 illustrates a schematic diagram of a filter according to another example.

FIG. 4 illustrates a schematic diagram of a filter 400 according to another example. The filter 400 may illustrate an example of the filter 216. The filter 400 includes a first inductor 402, a second inductor 404, and a coupled inductor 406 having a first portion 408 and a second portion 410. The first inductor 402 and the first portion 408 of the coupled inductor 406 may collectively represent an example of the first filtering component 214a. The second inductor 404 and the second portion 410 of the coupled inductor 406 may collectively represent an example of the second filtering component 214b.

The first inductor 402 is coupled to the first portion 408 of the coupled inductor 406 at a first connection, and is configured to be coupled to a first power converter at a second connection (for example, the first interleaved power converter 212a). In some examples, the first inductor 402 is magnetically coupled to the second inductor 404. The second inductor 404 is coupled to the second portion 410 of the coupled inductor 406 at a first connection, and is configured to be coupled to a second power converter at a second connection (for example, the second interleaved power converter 212b). In some examples, the second inductor 404 is magnetically coupled to the first inductor 402.

The first portion 408 of the coupled inductor 406 is coupled to the first inductor 402 at a dotted connection, and is coupled to an output (for example, the output 204 either directly or, in some examples, via the optional output filter 210) at a non-dotted connection. In some examples, the first portion 408 of the coupled inductor 406 is magnetically coupled to the second portion 410 of the coupled inductor 406. The second portion 410 of the coupled inductor 406 is coupled to the second inductor 404 at a non-dotted connection, and is coupled to an output (for example, the output 204 either directly or, in some examples, via the optional output filter 210) at a dotted connection. In some examples, the second portion 410 of the coupled inductor 406 is magnetically coupled to the first portion 408 of the coupled inductor 406.

The filter 400 may filter a signal received from the interleaved power converters 212 to provide a filtered output signal to the output 204. The first inductor 402 and the second inductor 404 of the filter 400 may operate in a similar manner as the first inductor 302 and the second inductor 304 of the filter 300. The coupled inductor 406 may act as a transformer in which a current in the first portion 408 of the coupled inductor 408 generates a magnetic field that cancels a magnetic field generated by an opposite-phase current in the second portion 410 of the coupled inductor 408. The filter 400 may therefore present a relatively large impedance to current in opposite phases, such as ripple currents at the PWM frequency.

However, the filter 400 may present a relatively small impedance to current that is in-phase with the load current at least partly because in-phase currents in the coupled inductor 406 generate magnetic fields that cancel one another out, thereby appearing approximately as a short circuit to in-phase currents. Accordingly, whereas the inductors 402, 404 may present a relatively large impedance to in-phase currents, the coupled inductor 406 may present a relatively large impedance to out-of-phase currents.

In various examples, the size of the inductors 402, 404 may be less than the size of the inductors 302, 304 at least partly because the ripple current at the PWM frequency and the odd harmonics thereof are minimized by the high impedance of the coupled inductor 406. Furthermore, a dynamic response of the filter 400 may be improved relative to the filter 300 at least in part because a load step presents a current to both of the inductors 402, 404 at a substantially similar time, thereby presenting in-phase currents to the legs of the filter 400.

As noted above, the inductors 402, 404 of the filter 400 may be considerably smaller than the inductors 302, 304 of the filter 300. However, the coupled inductor 406 may experience relatively high losses from harmonic voltages at the PWM frequency at least in part because, as discussed above, the coupled inductor 406 may be primarily responsible for absorbing the harmonic voltages in the filter 400. Although low-loss core materials may be implemented (for example, amorphous cores, ferrite cores, and so forth), these materials may be expensive, bulky, and/or introduce challenging design requirements. Furthermore, accurate current-sensing and control instrumentation may be implemented to avoid current imbalance and core saturation, thereby introducing additional cost and complexity.

Figure 5:
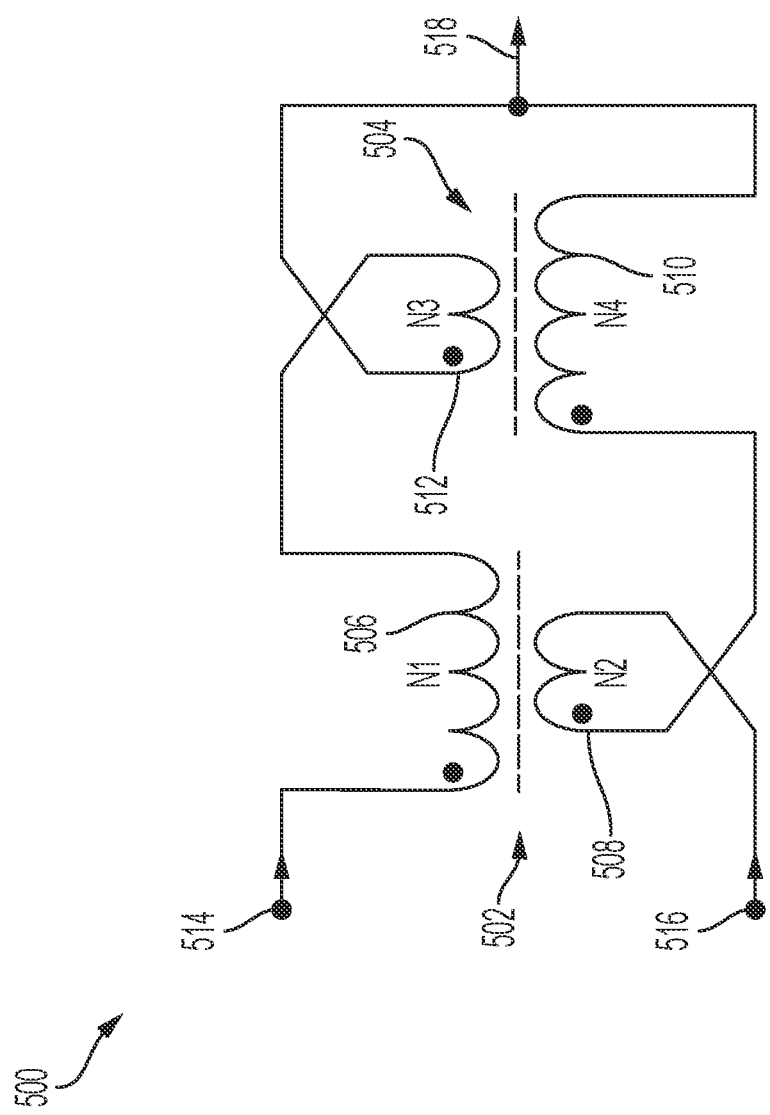
FIG. 5 illustrates a schematic diagram of a filter according to another example.

FIG. 5 illustrates a schematic diagram of a filter 500 according to another example. The filter 500 may illustrate an example of the filter 216. The filter 500 includes a first transformer 502 and a second transformer 504. The first transformer 502 includes a first primary winding 506 and a first secondary winding 508. The second transformer 504 includes a second primary winding 510 and a second secondary winding 512. The first primary winding 506 and the second secondary winding 512 may collectively represent an example of the first filtering component 214a. The first secondary winding 508 and the second primary winding 510 may collectively represent an example of the second filtering component 214b. The filter 500 further includes a first interleaved input 514, a second interleaved input 516, and an output 518.

The first primary winding 506 is coupled to the first interleaved input 514 at a dotted connection, and is coupled to the second secondary winding 512 at a non-dotted connection. In some examples, the first primary winding 506 is magnetically coupled to the first secondary winding 508. The first secondary winding 508 is coupled to the second interleaved input 516 at a non-dotted connection, and is coupled to the second primary winding 510 at a dotted connection. In some examples, the first secondary winding 508 is magnetically coupled to the first primary winding 506.

The second primary winding 510 is coupled to the first secondary winding 508 at a dotted connection, and is coupled to the output 518 at a non-dotted connection. In some examples, the second primary winding 510 is magnetically coupled to the second secondary winding 512. The second secondary winding 512 is coupled to the first primary winding 506 at a non-dotted connection, and is coupled to the output 518 at a dotted connection. In some examples, the second secondary winding 512 is magnetically coupled to the second primary winding 510.

The first interleaved input 514 is coupled to the first primary winding 506 and is configured to be coupled to a power converter (for example, the first interleaved power converter 212a). The second interleaved input 516 is coupled to the first secondary winding 508 and is configured to be coupled to a power converter (for example, the second interleaved power converter 212b). The output 518 is coupled to the second primary winding 510 and the second secondary winding 512, and is configured to be coupled to a power-converter output (for example, to the output 204 either directly or, in some examples, via the optional output filter 210).

A first signal may be received at the first interleaved input 514 and provided to the first primary winding 506. The first signal may generate a magnetic field in the first primary winding 506, which may induce a current in the first secondary winding 508. The first primary winding 506 may provide the first signal to the second secondary winding 512. The first signal may generate a magnetic field in the second secondary winding 512, which may induce a current in the second primary winding 510. The second secondary winding 512 may provide the first signal to the output 518.

A second signal may be received at the second interleaved input 516 and provided to the first secondary winding 508. The second signal may generate a magnetic field in the first secondary winding 508, which may induce a current in the first primary winding 506. The first secondary winding 508 may provide the second signal to the second primary winding 510. The second signal may generate a magnetic field in the second primary winding 510, which may induce a current in the second secondary winding 512. The second primary winding 510 may provide the second signal to the output 518.

In various examples, the transformers 502, 504 present an impedance to the first and/or second signals depending at least in part on a number of windings of the transformers 502, 504. The first primary winding 506 has N1 windings, the first secondary winding 508 has N2 windings, the second primary winding 510 has N4 windings, and the second secondary winding 512 has N3 windings. In one example, N1 is approximately equal to N4, and N2 is approximately equal to N3. An impedance presented by the transformers 502, 504 may also depend at least in part on a frequency of signals received by the transformers 502, 504.

Signals received at the PWM frequency arrive at the filter 500 in opposite phases due to the interleaving of the power converters. The magnetic fields generated by opposite-phase currents in the transformers 502, 504 may add with one another. The inductance presented to the signals by the first transformer 502 may be equal to $(N1+N2)^2 * A_L$, where $A_L$ is the specific inductance for a single turn for a used magnetic core of the windings 506, 508. In some examples, each of the turns of the windings 506, 508 may have the same specific inductance $A_L$. In other examples, the turns may have different specific inductances (for example, resulting from manufacturing differences), and $A_L$ may represent an average specific inductance of the turns. The inductance presented to the signals by the second transformer 504 may be equal to $(N3+N4)^2 * A_L$, where $A_L$ is the specific inductance for a single turn of a used magnetic core of the windings 510, 512. In some examples, each of the turns of the windings 510, 512 may have the same specific inductance $A_L$. In other examples, the turns may have different specific inductances (for example, resulting from manufacturing differences), and $A_L$ may represent an average specific inductance of the turns.

Signals received at the load-current frequency or other non-interleaved frequencies may arrive at the filter 500 in phase with one another. The magnetic fields generated by the in-phase currents in the transformers 502, 504 may oppose one another. The inductance presented to the signals by the first transformer 502 may be equal to $(N1-N2)^2 * A_L$, where $A_L$ is the specific inductance for a single turn for a used magnetic core of the windings 506, 508. In some examples, each of the turns of the windings 506, 508 may have the same specific inductance $A_L$. In other examples, the turns may have different specific inductances (for example, resulting from manufacturing differences), and $A_L$ may represent an average specific inductance of the turns. The inductance presented to the signals by the second transformer 504 may be equal to $(N4-N3)^2 * A_L$, where $A_L$ is the specific inductance for a single turn for a used magnetic core of the windings 510, 512. In some examples, each of the turns of the windings 510, 512 may have the same specific inductance $A_L$. In other examples, the turns may have different specific inductances (for example, resulting from manufacturing differences), and $A_L$ may represent an average specific inductance of the turns.

Accordingly, the transformers 502, 504 may present a different inductance (and, thus, a different impedance) to in-phase currents, such as signals at the load frequency, as opposed to out-of-phase currents, such as signals at the PWM frequency. An effective number of turns seen by in-phase currents, such as the load current, may be proportional to a difference (for example, a squared difference) between the number of primary and secondary windings of each of the transformers 502, 504. An effective number of turns seen by out-of-phase currents, such as signals at the PWM frequency, may be proportional to a sum (for example, a squared sum) of the number of primary and secondary windings of each of the transformers 502, 504. A magnetic field generated by in-phase currents may be reduced by the same factor by which the effective inductance is reduced (relative to, for example, other filters having the same number of turns but a different arrangement, such as the filter 300), which may allow a higher-core-permeability material to be used as a core material for the transformers 502, 504 without substantially changing a total relative core saturation.

Accordingly, examples provided herein improve power-converter filtering at least in part by reducing ripple current while improving a dynamic response to load-step currents. In various examples, the transformers 502, 504 may be designed to be substantially similar or identical components, thereby reducing a complexity of the filter 500. A number of windings of the transformers 502, 504 may be selected based on design requirements of the filter 500 and, in various examples, the transformers 502, 504 may include low-cost and/or low-complexity core materials. The filter 500 may therefore be reduced in size, cost, and/or complexity compared to some existing solutions.

As discussed above, N1, N2, N3, and N4 may be selected based on one or more design requirements. In some examples, N1 may be configured to be within a certain number of turns of N4. For example, N1 may be configured to be within 12 turns of N4. Continuing with this example, if N1 has 35 turns, then N4 may have between 23 and 47 turns. In other examples, N1 may be configured to have a number of turns that is within a certain percentage of a number of turns of N4. For example, N1 may be configured to have a number of turns that is within 20% of a number of turns of N4. Continuing with this example, if N1 has 35 turns, then N4 may have between 28 and 42 turns, that is, within seven turns of 35 turns.

Similarly, in various examples, N2 may be configured to be within a certain number of turns of N3. For example, N2 may be configured to be within two turns of N3. Continuing with this example, if N2 has seven turns, then N3 may have between five and nine turns. In other examples, N2 may be configured to have a number of turns that is within a certain percentage of a number of turns of N3. For example, N2 may be configured to have a number of turns that is within 20% of a number of turns of N3. Continuing with this example, if N2 has seven turns, then N3 may have between six and eight turns, that is, within 1.4 turns of seven turns.

In one example, a ratio of N1:N2 and of N4:N3 is between 4:1 and 6:1. In one example, N1 and N4 are each approximately 35, and N2 and N3 are each approximately seven. Accordingly, in one example, N1 is equal to N4, N2 is equal to N3, and N1:N2 is 35:7.

As discussed above, the optional output filter 210 may include one or more filtering components. In one example, the optional output filter 210 includes one or more capacitors. For example, the optional output filter 210 may include one or more capacitors presenting a capacitance of 40 μF to signals originating from each of the second primary winding 510 and the second secondary winding 512. In some examples, a capacitance may depend in part on N1, N2, N3, N4, and $A_L$. In some examples, $A_L$ may be approximately 138 nH.

In various examples, components of the power converter 200 may be added, removed, and/or rearranged where the power converter 200 is bi-directional. For example, the power converter 200 may include additional filters between the interleaved power converters 212 and the input 202, and/or may include one or more bypass switches to route signals as needed or desired.

Various controllers, such as the controller 112, may execute various operations discussed above. For example, as discussed above, the controller 112 may control switching operation of the converters 104, 108, 114, amongst other operations. Using data stored in associated memory and/or storage, the controller 112 may execute one or more instructions stored on one or more non-transitory computer-readable media, which the controller 112 may include and/or be coupled to, that may result in manipulated data. In some examples, the controller 112 may include one or more processors or other types of controllers. In one example, the controller 112 is or includes at least one processor. In another example, the controller 112 performs at least a portion of the operations discussed above using an application-specific integrated circuit tailored to perform particular operations in addition to, or in lieu of, a general-purpose processor. As illustrated by these examples, examples in accordance with the present disclosure may perform the operations described herein using many specific combinations of hardware and software and the disclosure is not limited to any particular combination of hardware and software components. Examples of the disclosure may include a computer-program product configured to execute methods, processes, and/or operations discussed above. The computer-program product may be, or include, one or more controllers and/or processors configured to execute instructions to perform methods, processes, and/or operations discussed above.

Having thus described several aspects of at least one embodiment, it is to be appreciated various alterations, modifications, and improvements will readily occur to those skilled in the art. Such alterations, modifications, and improvements are intended to be part of, and within the spirit and scope of, this disclosure. Accordingly, the foregoing description and drawings are by way of example only.

What is claimed is:

1. A filter comprising:
a first interleaved input configured to receive a first signal;
a second interleaved input configured to receive a second signal in phase with the first signal;
an output;
a first transformer comprising a first primary winding with N1 turns and a first secondary winding with N2 turns; and
a second transformer comprising a second primary winding with N4 turns and a second secondary winding with N3 turns, wherein
the first primary winding and the second secondary winding are in series with the first interleaved input and the output, and
the first secondary winding and the second primary winding are in series with the second interleaved input and the output.

2. The filter of claim 1, wherein the first primary winding and the first secondary winding are configured to generate in-phase magnetic fields that cancel each other.

3. The filter of claim 1, wherein the second primary winding and the second secondary winding are configured to generate in-phase magnetic fields that cancel each other.

4. The filter of claim 1, wherein a number of turns of N1 is within 20% of a number of turns of N4.

5. The filter of claim 4, wherein a number of turns of N2 is within 20% of a number of turns of N3.

6. The filter of claim 1, wherein a number of turns of N2 is within 20% of a number of turns of N3.

7. The filter of claim 1, wherein a dotted pole of the first primary winding is coupled to the first interleaved input, and a non-dotted pole of the first primary winding is coupled to the second secondary winding.

8. The filter of claim 7, wherein a non-dotted pole of the first secondary winding is coupled to the second interleaved input, and a dotted pole of the first secondary winding is coupled to the second primary winding.

9. The filter of claim 7, wherein a non-dotted pole of the second secondary winding is coupled to the non-dotted pole of the first primary winding, and a dotted pole of the second secondary winding is coupled to the output.

10. The filter of claim 9, wherein a dotted pole of the second primary winding is coupled to the first secondary winding, and a non-dotted pole of the second primary winding is coupled to the output.

11. The filter of claim 10, wherein a non-dotted pole of the first secondary winding is coupled to the second interleaved input, and a dotted pole of the first secondary winding is coupled to the dotted pole of the second primary winding.

12. The filter of claim 1, wherein the first interleaved input is configured to be coupled to a first interleaved inverter, and wherein the second interleaved input is configured to be coupled to a second interleaved inverter.

13. The filter of claim 1, wherein a series of the first primary winding and the second secondary winding is coupled in parallel with a series combination of the first secondary winding and the second primary winding.

14. The filter of claim 1, wherein a first magnetic field generated by the first primary winding responsive to receiving the first signal cancels with a second magnetic field generated by the second primary winding responsive to receiving the second signal.

15. The filter of claim 1, wherein responsive to receiving the first signal at an in-phase frequency and the second signal at the in-phase frequency, the first transformer and the second transformer present an impedance to the first and second signal that is proportional to a square of a difference between N1 and N2.

16. The filter of claim 15, wherein the output is configured to be coupled to, and provide output power to, at least one load, and wherein the in-phase frequency of the first signal and the second signal is a frequency of the output power.

17. A method of filtering a signal, the method comprising:
receiving, at a first interleaved input, a first signal;
providing the first signal to a first primary winding of a first transformer comprising the first primary winding with N1 turns and a first secondary winding with N2 turns;
providing the first signal from the first primary winding to a second secondary winding of a second transformer comprising a second primary winding with N4 turns and the second secondary winding with N3 turns;
providing the first signal from the second secondary winding to an output;
receiving, at a second interleaved input, a second signal in phase with the first signal;
providing the second signal to the first secondary winding;
providing the second signal from the first secondary winding to the second primary winding; and
providing the second signal from the second primary winding to the output.

18. A filter comprising:
a first interleaved input configured to receive a first signal;
a second interleaved input configured to receive a second signal having a phase opposite that of the first signal;
an output;
a first transformer comprising a first primary winding with N1 turns and a first secondary winding with N2 turns; and
a second transformer comprising a second primary winding with N4 turns and a second secondary winding with N3 turns, wherein
the first primary winding and the second secondary winding are in series with the first interleaved input and the output, and
the first secondary winding and the second primary winding are in series with the second interleaved input and the output, and
wherein responsive to receiving the first signal at an opposite-phase frequency and the second signal at the opposite-phase frequency, the first transformer and the second transformer present an impedance to the first and second signal that is proportional to a square of a sum of N1 and N2.

19. The filter of claim 18, wherein a first magnetic field generated by the first primary winding responsive to receiving the first signal sums with a second magnetic field generated by the second primary winding responsive to receiving the second signal.

20. The filter of claim 18, wherein the first interleaved input and the second interleaved input are configured to be coupled to a power converter having one or more switches configured to receive pulse-width modulation switching signals, and wherein the opposite-phase frequency of the first signal and the second signal is a frequency of the pulse-width modulation switching signals.

21. A filter comprising:
a first interleaved input;
a second interleaved input;
an output;
a first transformer comprising a first primary winding with N1 turns and a first secondary winding with N2 turns; and
a second transformer comprising a second primary winding with N4 turns and a second secondary winding with N3 turns, wherein
the first primary winding and the second secondary winding are in series with the first interleaved input and the output,
the first secondary winding and the second primary winding are in series with the second interleaved input and the output,
a dotted pole of the first primary winding is coupled to the first interleaved input,
a non-dotted pole of the first primary winding is coupled to the second secondary winding,
a non-dotted pole of the first secondary winding is coupled to the second interleaved input, and
a dotted pole of the first secondary winding is coupled to the second primary winding.

22. The filter of claim 21, wherein a dotted pole of the second primary winding is coupled to the first secondary winding, and a non-dotted pole of the second primary winding is coupled to the output.

23. A filter comprising:
a first interleaved input;
a second interleaved input;
an output;
a first transformer comprising a first primary winding with N1 turns and a first secondary winding with N2 turns; and
a second transformer comprising a second primary winding with N4 turns and a second secondary winding with N3 turns, wherein
the first primary winding and the second secondary winding are in series with the first interleaved input and the output,
the first secondary winding and the second primary winding are in series with the second interleaved input and the output,
a dotted pole of the first primary winding is coupled to the first interleaved input,
a non-dotted pole of the first primary winding is coupled to the second secondary winding,
a non-dotted pole of the second secondary winding is coupled to the non-dotted pole of the first primary winding, and
a dotted pole of the second secondary winding is coupled to the output.

* * * * *